United States Patent
Djordjevic et al.

(10) Patent No.: US 9,735,921 B2
(45) Date of Patent: Aug. 15, 2017

(54) ULTRA-HIGH SPEED OPTICAL TRANSPORT EMPLOYING LDPC-CODED MODULATION WITH NON-UNIFORM SIGNALING

(71) Applicant: NEC Laboratories America, Inc., Princeton, NJ (US)

(72) Inventors: Ivan Djordjevic, Tuscon, AZ (US); Ting Wang, West Windsor, NJ (US)

(73) Assignee: NEC Corporation (JP)

( * ) Notice: Subject to any disclaimer, the term of this patent is extended or adjusted under 35 U.S.C. 154(b) by 0 days.

(21) Appl. No.: 15/138,184

(22) Filed: Apr. 25, 2016

(65) Prior Publication Data

US 2016/0315704 A1    Oct. 27, 2016

Related U.S. Application Data

(60) Provisional application No. 62/152,120, filed on Apr. 24, 2015.

(51) Int. Cl.
*H04B 10/04* (2006.01)
*H04L 1/00* (2006.01)
*H03M 13/11* (2006.01)
*H04B 10/516* (2013.01)

(52) U.S. Cl.
CPC ....... *H04L 1/0058* (2013.01); *H03M 13/1102* (2013.01); *H04B 10/516* (2013.01); *H04L 1/0041* (2013.01)

(58) Field of Classification Search
CPC .............. H04B 10/5161; H04B 10/516; H04B 10/5561; H04B 10/532; H04B 10/541; H04B 10/548; H04J 14/02; H04J 14/04; H04J 14/06
USPC ....... 398/183, 184, 198, 185, 186, 187, 192, 398/193, 194, 135, 136, 202, 205, 208, 398/65, 152, 158, 159, 79
See application file for complete search history.

(56) References Cited

U.S. PATENT DOCUMENTS

| | | | | |
|---|---|---|---|---|
| 5,285,497 A | * | 2/1994 | Thatcher, Jr. ........... | G06T 9/005 348/425.2 |
| 2009/0235143 A1 | * | 9/2009 | Djordjevic .......... | H03M 13/255 714/752 |
| 2012/0263251 A1 | * | 10/2012 | Djordjevic ............ | H04L 1/0042 375/261 |

* cited by examiner

*Primary Examiner* — Hanh Phan
(74) *Attorney, Agent, or Firm* — Joseph Kolodka

(57) ABSTRACT

A low-density parity-check (LDPC) coded bit-interleaved coded modulation with iterative decoding (BICM-ID) scheme with nonuniform signaling which is effected by mapping simple variable-length prefix codes onto the constellation. By employing Huffman procedure(s), prefix codes can be designed to approach optimal performance. Experimental evaluations of the schemes demonstrate that the nonuniform scheme performs better than 8-QAM by at least 8.8 dB.

4 Claims, 8 Drawing Sheets

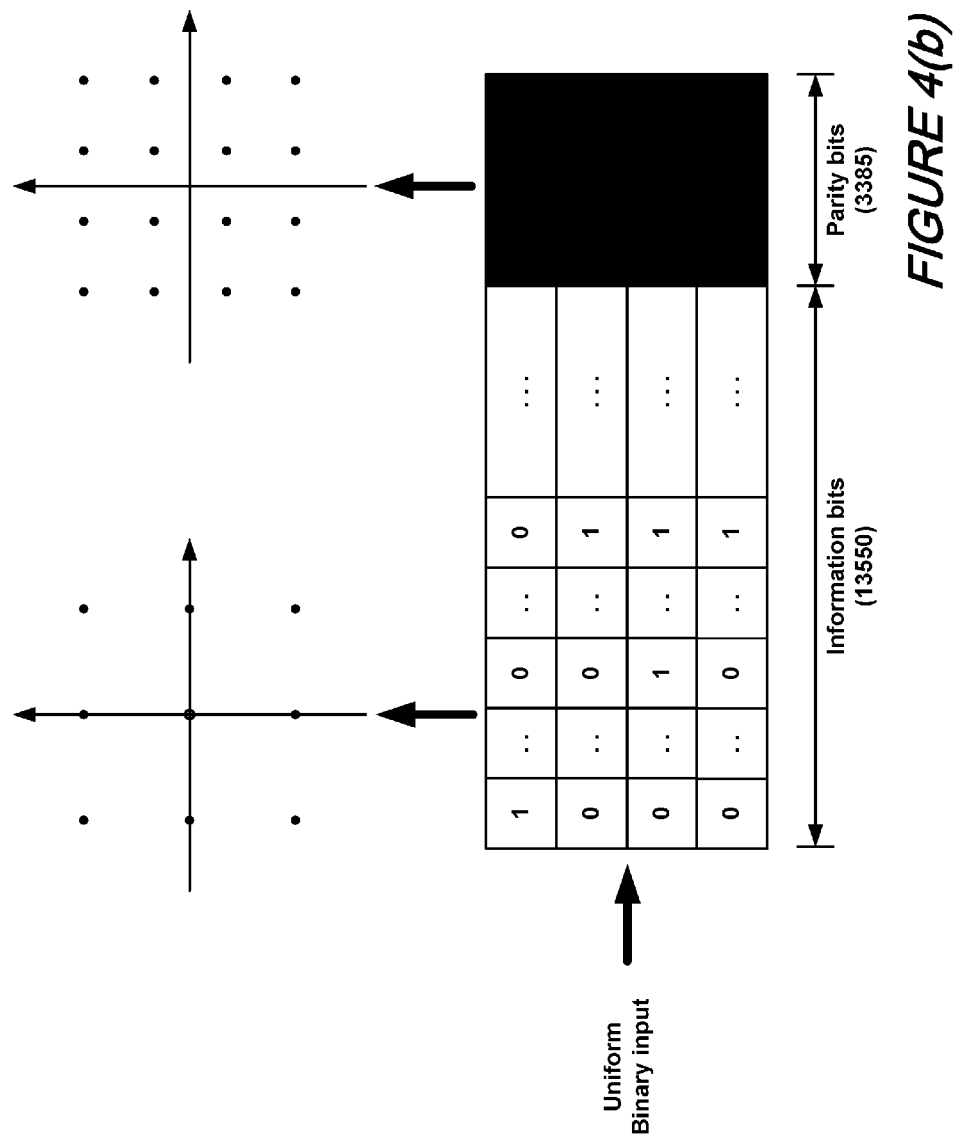

ULTRA-HIGH SPEED OPTICAL TRANSPORT EMPLOYING LDPC-CODED MODULATION WITH NON-UNIFORM SIGNALING

CROSS REFERENCE TO RELATED APPLICATIONS

This application claims the benefit of U.S. Provisional Patent Application Ser. No. 62,152,120 filed Apr. 24, 2015 the entire contents of which are incorporated by reference as if set forth at length herein.

TECHNICAL FIELD

This disclosure relates generally to telecommunications and in particular to ultra-high speed optical transport employing low-density parity-check code (LDPC) coded modulation with non-uniform signaling.

BACKGROUND

The exponential growth of internet traffic and even larger growth projections has precipitated an enormous demand for transmission bandwidth at every level of underlying information infrastructure. In partial response, a 100 Gb/s Ethernet (100 GbE) standard has been recently adopted by the Institute of Electrical and Electronics Engineers (IEEE 802.3ba) and 400 GbE and T Tb/s Ethernet (1 TbE) are currently under study. As may be readily appreciated, terabit optical Ethernet technologies will be affected by the limited bandwidth, high energy consumption and heterogeneity of optical networking infrastructure. To exceed beyond 1 Tb/s serial data rates however, large signal constellation sizes are required for polarization-division multiplexed (PDM) single-carrier quadrature amplitude modulation (QAM) systems with commercially achievable symbol rates. Furthermore, in the context of high-speed optical communications systems, not only the performance of advanced coded modulation schemes but also their complexity is of critical importance.

Given the importance of optical communications systems to contemporary and future communications systems, techniques that enhance their performance would represent a welcome addition to the art.

SUMMARY

An advance in the art is made according to the present disclosure which describes an LDPC coded modulation scheme with non-uniform signaling which maps simple variable-length prefix codes onto a constellation. By using a Huffman procedure, prefix codes can be advantageously designed to approach an optimal performance. Advantageously, scheme(s) according to the present disclosure are suitable for arbitrary non-uniform signaling where information bits and parity bits transmitted with different modulation schemes in order to achieve the same data rate as compared to conventional modulation schemes. Experimental evaluations of the schemes demonstrate that the nonuniform scheme performs better than 8-QAM by at least 8.8 dB.

BRIEF DESCRIPTION OF THE DRAWING

A more complete understanding of the present disclosure may be realized by reference to the accompanying drawing in which:

FIGS. 4(a) and 4(b) show representative block interleaver structure(s) for (a) 8-QAM and (b) 9-QAM according to aspects of the present disclosure;

Figure 1B:
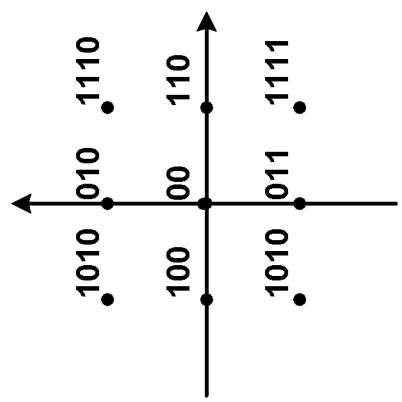
FIGS. 1(a) and 1(b) show representative constellation sets according to the present disclosure for (a) 1D 3-PAM, and (b) 2D 9-QAM.

The illustrative embodiments are described more fully by the Figures and detailed description. Inventions according to this disclosure may, however, be embodied in various forms and are not limited to specific or illustrative embodiments described in the Figures and detailed description

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Figures, including any functional blocks labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Unless otherwise explicitly specified herein, the FIGURES are not drawn to scale.

We begin by again noting one key technology for next generation optical transport is the LDPC-coded super-channel orthogonal-frequency-division-multiplexed (OFDM). Such an approach is typically considered for single mode fiber (SMF) applications and it is based on conventional quadrature-amplitude-modulation (QAM) scheme(s). Also, it is noteworthy that some non-conventional approaches to achieve data rates beyond 1 Tb/s of serial optical transport over SMFs include generalized OFDM (GOFDM). Other approaches proposed the use of hybrid multidimensional coded modulation (CM), employing both electrical and optical degrees of freedom to address noted constraints in a simultaneous manner. Optical degrees of freedom include the polarization and spatial modes in few-mode fibers (FMFs) and few core fibers (FCF). The electrical degrees of freedom include orthogonal prolate spheroidal wave functions. These degrees of freedom are used and the basis functions for multidimensional signaling.

Constellation Shaping with Huffman Code

Figure 1A:

A method according to the present disclosure for achieving non-uniform signaling schemes for the transmission of binary data (constellation shaping with Huffman code) may be described as follows. Output of a uniform binary memoryless source is parsed into a sequence of blocks drawn from the set {0, 01, 11} and these blocks are represented as symbols such that they may be mapped onto a PAM constellation as shown in FIG. 1(a). This scheme has an average bit rate of 1.5 bits/T where T is the symbol duration because $$\rho[0] = \frac{1}{2}, \rho[10] = \rho[11] = \frac{1}{4}.$$

If we place two such 1D 3-PAM schemes along phase and quadrature components, we can obtain the 2D 9-QAM constellation set which can achieve an average bit rate of 3 bits/T. Notice that in this constellation set—which is shown in FIG. 1(b)—each symbol can represent either two, three or four bits and they are transmitted with different probabilities. This mapping is found by using Huffman procedure.

Figure 2:
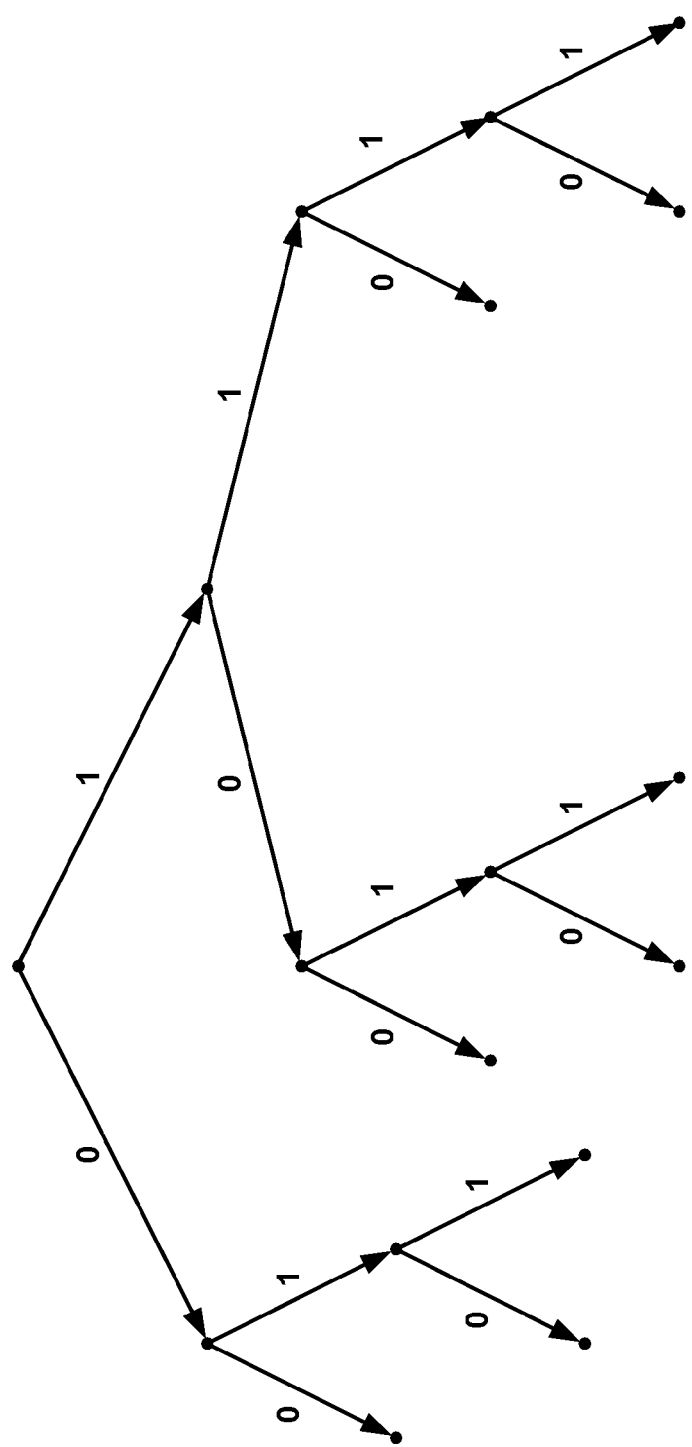
FIG. 2 is a tree representation of Huffman code used in 2D 9-QAM non-uniform signaling according to an aspect of the present disclosure.
Figure 3:
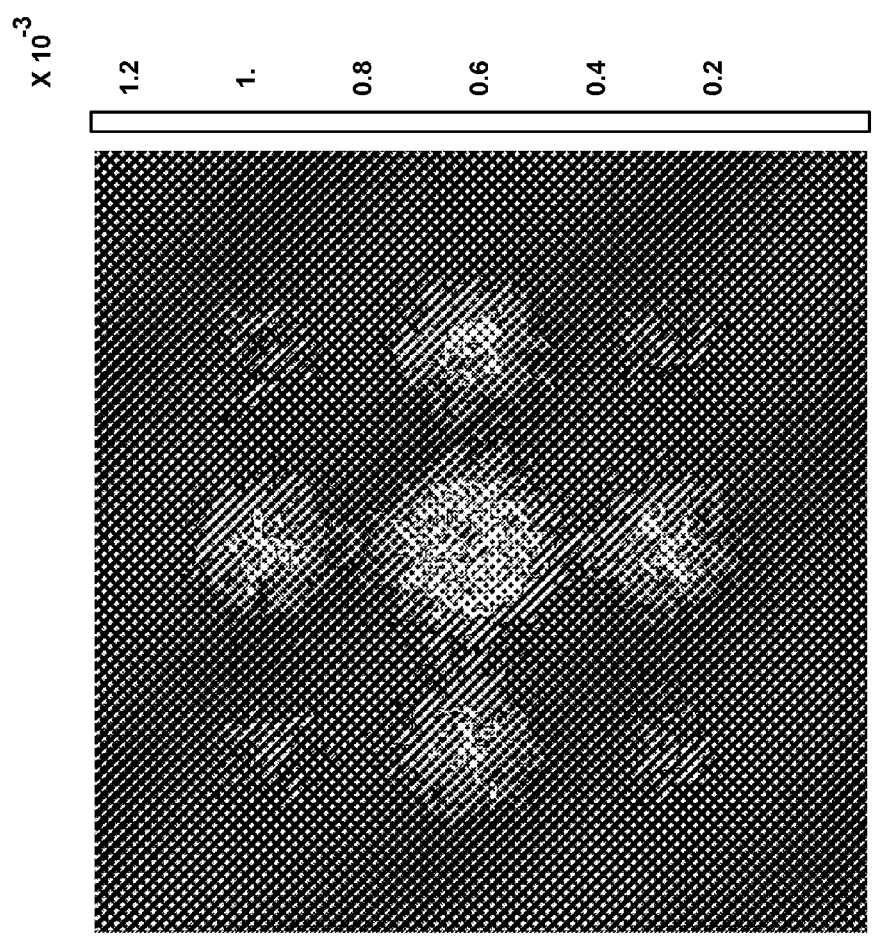
FIG. 3 shows 2D 9-QAM non-uniform signaling transmission according to the present disclosure.

The tree representation of the Huffman code used to map the constellation is shown in FIG. 2. A look-up table of the probability for each symbol during transmission is shown in Table 1. As an illustration, the received symbol constellation for ASE dominated channel based on 2D 9-QAM transmission is shown in FIG. 3, where the probabilities of using constellation points are shown. Advantageously—and as will be readily appreciated by those skilled in the art, this approach may be generalized to an arbitrary spectral efficiency. More particular, instead of a 2D constellation, N-dimensional constellations (N23) may be employed as well.

LDPC Coded Modulation Scheme with Non-Uniform Signaling

In order to maintain shaping gain brought about by non-uniform signaling and the possibility of using joint source-channel decoding (JSCD) techniques, an LDPC coded modulation scheme for arbitrary non-uniform signaling according to the present disclosure is introduced. As an illustrative example, we employ a quasi-cyclic LDPC code exhibiting a rate r≥0.8, codeword length n, and information word-length of k.

Figure 4A:
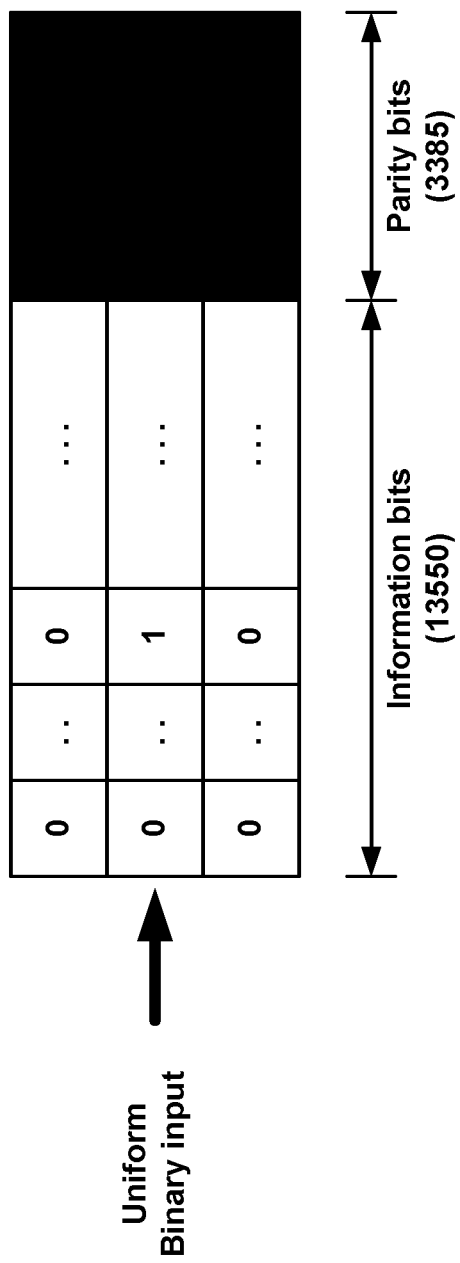

One particularly noteworthy aspect of this scheme is the block interleaver. With initial reference to FIG. 4(a), there is shown a conventional block interleaver of 8-QAM. As depicted therein, uniform binary data is written in row-wise into the interleaver with a size of $(n-k) \times \log_2 M$, where M is the size of the constellation. Each row is subsequently encoded with the LDPC code and the resulting size of the interleaver is $n \times \log_2 M$. At the end, each column will be mapped to one of the constellation points.

FIG. 4(b) shows an interleaver scheme according to the present disclosure. The interleaving process may be described as follows—while observing 9-QAM as an illustrative example.

First, binary information bits are first written into the last two rows of the interleaver. The interleaver size for non-uniform signaling is $n \times L_M$, where $L_M$ is the max source-codeword length of the corresponding Huffman code. Next, bits are read in column-wise fashion from bottom to top for the last two rows. If the two bits are not 00, then the information bits are written to the third row, otherwise that position is left blank. Next, the bits are read column-wise from bottom to top for the last three rows. If the three bits are in the set [101, 111] then continue writing the information bits to the fourth row, otherwise leave the position blank. Next, fill the blank position with puncture bits—according to Table 1. Finally, encode every row bits with QC-LDPC encoder and generate parity bit blocks.

As may be observed from FIG. 4(b), an interleaver scheme according to the present disclosure requires one more row than a conventional, prior art interleaver for the purpose of maintaining the same bit rate. The bits marked as read can be considered as punctured bits only used for bit log-likelihood ratio (LLR) calculation(s). To solve this problem, the parity blocks are transmitted with 16-QAM and maintain the same data rate as conventional 8-QAM. In each time frame—which corresponds to the time duration for transmitting each block, the interleaver according to the present disclosure will first transmit 9-QAM symbols followed by 16-QAM symbols.

Figure 5A:
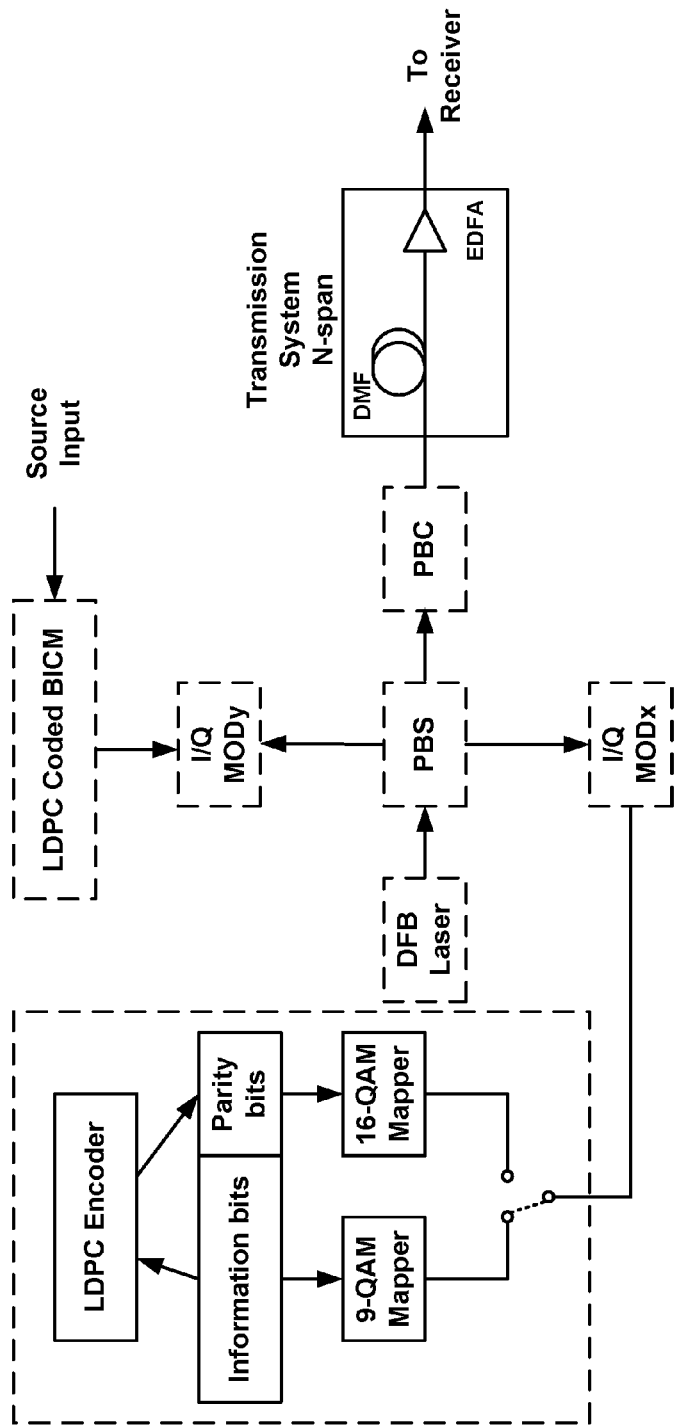
FIGS. 5(a) and 5(b) shows schematic of a polarization multiplexed LDPC coded non-uniform signaling transmission scheme according to an aspect of the present disclosure for (a) transmitter side of transmission scheme, and (b) receiver side of transmission scheme wherein PBS/C is a polarization beam splitter/combiner, MAP is maximum a posteriori probability, and LLRs is log-likelihood ratios.
Figure 5B:
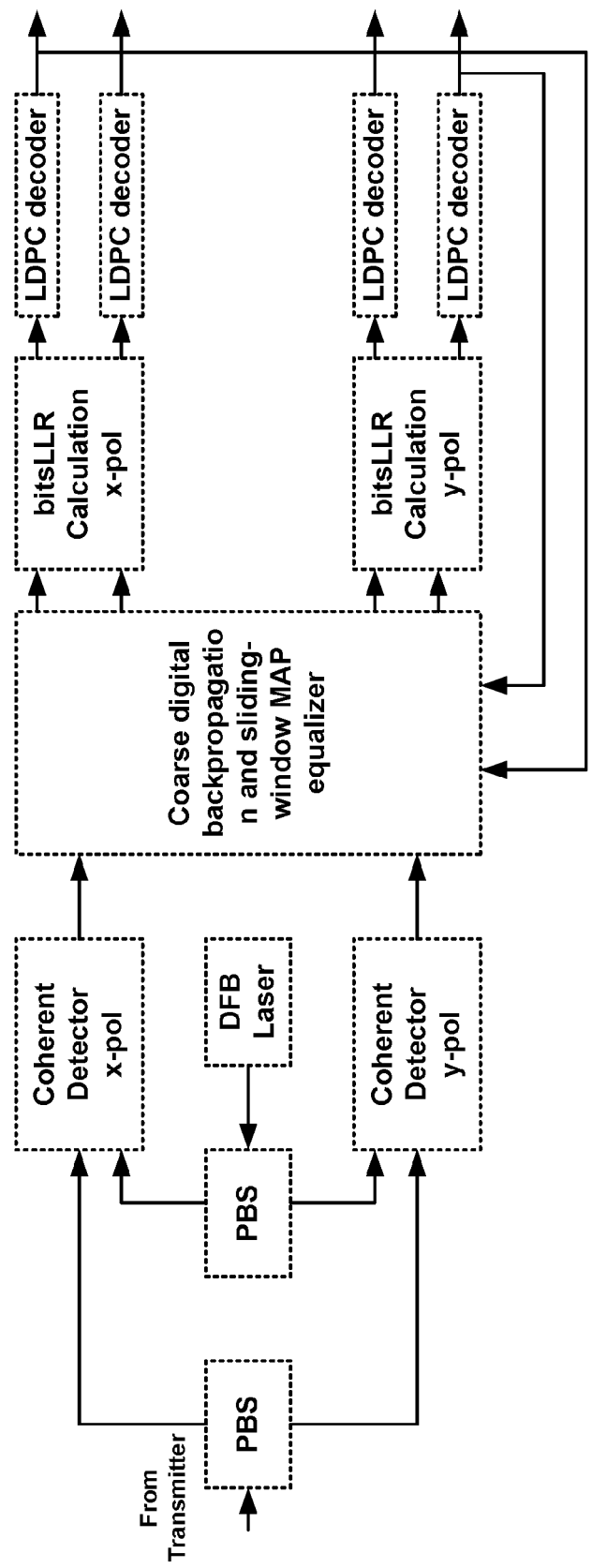

FIG. 5 shows in schematic form the entire coded modulation scheme according to aspects of the present disclosure. As may be understood with reference to that Figure—at a transmitter side of a telecommunications transmission system—the block interleaver is filled by the binary uniform input as well as by the QC-LDPC encoder. Then, the $L_M$ bits taken from the interleaver in column-wise fashion are mapped onto the 9-QAM constellation through the effect of I/Q modulator. Independent polarization streams are combined by polarization beam combiner and transmitted via a transmission system.

On a receiver side of that telecommunications transmission system, a conventional polarization diversity receiver may advantageously be employed—with a small number of coefficients in digital backpropagation scheme to reduce channel memory so that the complexity of a sliding-window MAP equalizer that follows is not too high. The sliding-MAP equalizer provides soft symbol LLRs, which are used to determine bit LLRs and further passed to LDPC decoders.

Accordingly, symbol LLRs calculation may be summarized as follows:

$$\lambda(s) = \log \frac{P(s = s_0 \mid r)}{P(s \neq s_0 \mid r)}$$

where $s=(I_i, Q_i)$ denotes the transmitted signal constellation point at time instant i, while $r=(r_i, r_i)$ denotes the received point. Symbol LLRs are denoted by $\lambda(s)$.

Bit LLRs can be determined from symbol LLRs as:

$$L(\hat{c}_j) = \log \frac{\sum s; c_{j=0} \exp[\lambda(s)]}{\sum s; c_{j=1} \exp[\lambda(s)]}$$

Note that when performing the bit LLRs calculation, the punctured bits will be considered as normal bits in order to avoid ambiguities caused by the non-uniform signaling. The extrinsic LLRs for the next iteration in LDPC decoders are calculated by:

$$L_{M,e}(\hat{c}_j) - L_{D,e}(\hat{c}_j)$$

where $L_{D,e}(c_j)$ is the LDPC decoder extrinsic LLRs which are forwarded to the sliding-MAP equalizer, so that the symbol a priori LLRs are calculated as:

$$\lambda_a(s) = \sum_{j=0}^{L_M - 1} (1 - c_j) L_{D,e}(c_j)$$

The iteration occurring between the LDPC decoder extrinsic LLRs is performed until the maximum number of iterations is reached. Regarding the LDPC decoder, a sum-product algorithm is generally employed.

Simulation Results

Figure 6:
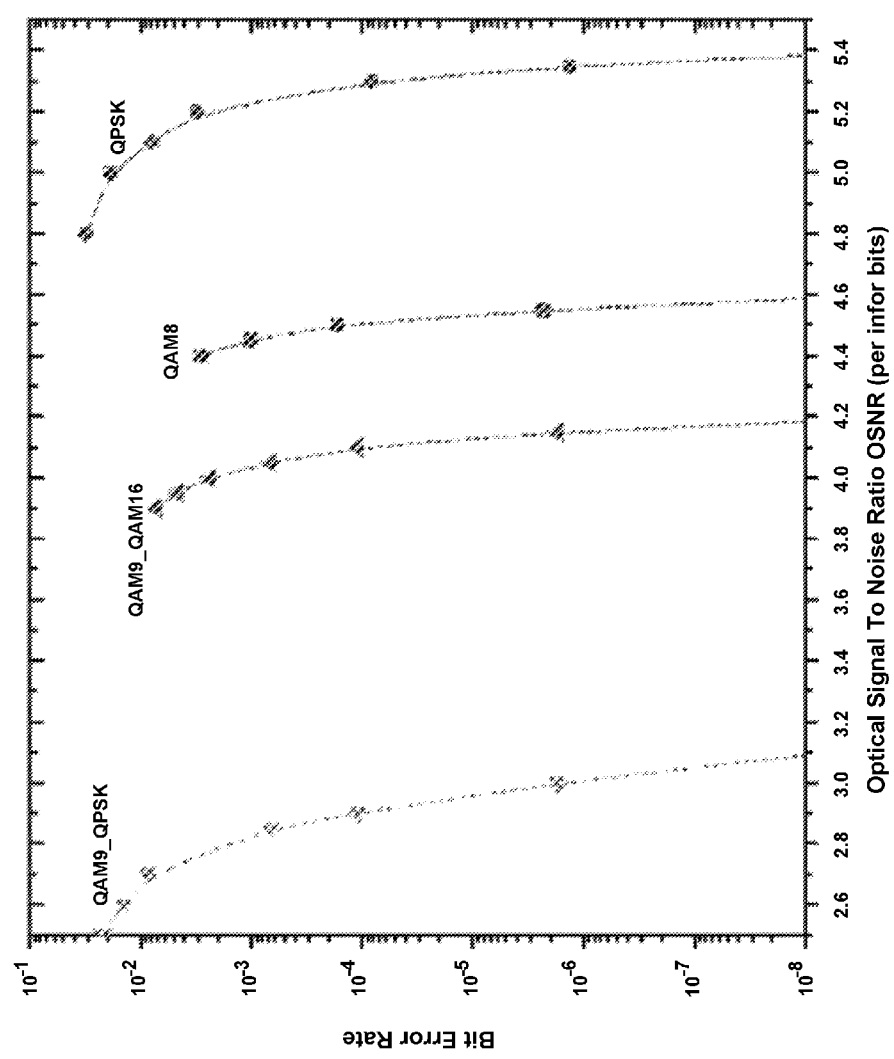
FIG. 6 shows a graph depicting bit error rate (BER) results of a non-uniform signaling scheme according to an aspect of the present disclosure.

To illustrate the efficiency of methods performed according to the present disclosure, Monte Carlo simulations have been performed and the results summarized graphically in FIG. 6. As depicted in that Figure, the symbol rate is 31.25 GS/s. The quasi-cyclic LDPC code wit rate r=0.8, codeword length n=16935, and parity bit length n−k=3385. Note that the legend "QAM9_QPSK" as used in that Figure denotes that information bits are transmitted by 9-QAM based on non-uniform signaling while parity bits are transmitted by QPSK. The "QAM9_16QAM" introduced previously and "QAM8" have the same data rate as it is evident that the non-uniform signaling scheme according to the present disclosure outperforms 8-QAM by about 0.8 Db. If QPSK is used to transmit parity bits, the performance may be further improved by about 0.4 dB, while slightly reducing the spectral efficiency.

TABLE 1

Probability of Each Symbol and Corresponding Punctured Bits

| Information Bits | Probability | Punctured Bits |
|---|---|---|
| 00 | 0.25 | 01 |
| 010 | 0.125 | 0 |
| 110 | 0.125 | 1 |
| 011 | 0.125 | 0 |
| 100 | 0.125 | 1 |
| 1110 | 0.0625 | N/A |
| 1111 | 0.0625 | N/A |
| 1010 | 0.0625 | N/A |
| 1011 | 0.0625 | N/A |

At this point, while we have presented this disclosure using some specific examples, those skilled in the art will recognize that our teachings are not so limited. Accordingly, this disclosure should be only limited by the scope of the claims attached hereto.

The invention claimed is:

1. A method for transmitting data, comprising: receiving a set of information bits, encoding the set of information bits using one or more low density parity check (LDPC) encoders with nonuniform signaling, employing one or more signal constellations wherein variable-length prefix codes are mapped onto the set of constellation points, wherein said constellation points are chosen such that they exhibit a nonuniform probability distribution, and transmitting the encoded data over a transmission medium;

wherein the constellation points are chosen according to a Maxwell-Boltzmann distribution; and wherein the nonuniform signaling is an arbitrary nonuniform signaling, wherein information bits and parity bits are transmitted with different modulation schemes.

2. The method according to claim 1 wherein the nonuniform signaling is effected by either Huffmann or Lempel-Zif encoding.

3. The method according to claim 1 further comprising performing a block interleaved coded modulation (BICM) with independent decoding (ID).

4. A system for transmitting data comprising: one or more low density parity check (LDPC) encoders configured to encode one or more streams of input data; a signal constellation generation module configure to generate one or more signal constellations wherein variable-length prefix codes are mapped onto the set of constellation points, wherein said constellation points are chosen such that they exhibit a nonuniform probability distribution, and a coherent optical-orthogonal frequency division multiplexing transmitter configured to transmit the encoded data over a transmission medium;

wherein the constellation points are chosen according to a Maxwell-Boltzmann distribution; and wherein the nonuniform signaling is an arbitrary nonuniform signaling, wherein information bits and parity bits are transmitted with different modulation schemes.

\* \* \* \* \*